(12) United States Patent
Okamura et al.

(10) Patent No.: US 7,119,020 B2
(45) Date of Patent: Oct. 10, 2006

(54) METHOD FOR FABRICATING SEMICONDUCTOR DEVICE

(75) Inventors: Hideaki Okamura, Osaka (JP); Takao Yamaguchi, Kyoto (JP); Tomoyuki Sasaki, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 182 days.

(21) Appl. No.: 10/720,197

(22) Filed: Nov. 25, 2003

(65) Prior Publication Data

US 2004/0106257 A1   Jun. 3, 2004

(30) Foreign Application Priority Data

Dec. 4, 2002 (JP) .............................. 2002-352778

(51) Int. Cl.
  *H01L 21/302* (2006.01)
  *H01L 21/461* (2006.01)
(52) U.S. Cl. ...................... 438/689; 438/706
(58) Field of Classification Search ............... 438/689, 438/694–696, 723, 743, 751, 706, 719, 734, 438/736, 725, 735, 756
See application file for complete search history.

(56) References Cited

U.S. PATENT DOCUMENTS

| 6,187,688 B1* | 2/2001 | Ohkuni et al. ............. 438/725 |
| 6,358,842 B1* | 3/2002 | Zhou et al. ................ 438/633 |
| 6,576,066 B1* | 6/2003 | Namatsu ..................... 134/30 |
| 6,746,961 B1* | 6/2004 | Ni et al. .................... 438/700 |
| 6,869,542 B1* | 3/2005 | Desphande et al. ........... 216/51 |

FOREIGN PATENT DOCUMENTS

| JP | 7-2888247 | * 10/1995 |
| WO | WO98/32162 | 7/1998 |

* cited by examiner

*Primary Examiner*—Hoai Pham
*Assistant Examiner*—Dilinh Nguyen
(74) *Attorney, Agent, or Firm*—McDermott Will & Emery LLP

(57) ABSTRACT

A silicon oxide film is formed on a semiconductor substrate made of silicon. Subsequently, a resist film containing carbon is formed on the silicon oxide film, and thereafter the formed resist film is patterned, thereby forming a resist pattern. Subsequently, the resist pattern is exposed to a sulfur dioxide gas, and then dry etching is performed on the silicon oxide film by using the resist pattern exposed to the sulfur dioxide gas as a mask.

7 Claims, 3 Drawing Sheets

METHOD FOR FABRICATING SEMICONDUCTOR DEVICE

BACKGROUND OF THE INVENTION

The present invention relates to a method for fabricating a semiconductor device that can prevent resist collapse from being caused by resist patterning in a dry etching process.

A known method for fabricating a semiconductor device will be described with reference to the drawings.

FIGS. 3A through 3D show the cross-sectional structures of a semiconductor device in the order corresponding to process steps of the known method for fabricating the same.

First, as shown in FIG. 3A, a thermal oxide film 102 is formed in the upper part of a semiconductor substrate 101 made of silicon. Subsequently, the top of the formed thermal oxide film 102 is coated with a resist film. Thereafter, the resist film is patterned using a lithography method, thereby forming a resist pattern 103.

Next, as shown in FIG. 3B, dry etching is performed on the thermal oxide film 102 by using the resist pattern 103 as a mask. For example, when capacitively coupled plasma etching equipment is employed, etching conditions are as follows: tetrafluorocarbon ($CF_4$) is supplied at a flow rate of 50 ml/min; trifluoromethyl ($CHF_3$) is supplied at a flow rate of 30 ml/min; oxygen ($O_2$) is supplied at a flow rate of 5 ml/min; the gas pressure is 5 Pa; the upper discharge power is 1000 W; and the lower discharge power is 1500 W. Here, the flow rate of each gas is the one in a standard state, i.e., under 0° C. and 1 atm.

In recent years, the processing precision of semiconductor devices has become finer, and thus smaller pattern sizes have also been required for resist patterns 103 used as masks for patterning a film to be etched. Therefore, the physical strength of the resist patterns 103 has become smaller (see, for example, International Publication Number WO98/32162 pamphlet).

In addition, even when a semiconductor device becomes finer, the thickness of a film to be etched hardly changes. This disables the thickness of a resist pattern 103 to become smaller, because it is necessary that the selectivity to the resist at dry etching is ensured. Thus, the value of the aspect ratio (the height to the line width) of the resist pattern 103 at pattern formation has been larger.

On the other hand, a dry etching process allows the resist pattern 103 to be etched not only in the vertical direction but also in the parallel direction with respect to the principal surface of the semiconductor substrate 101. This results in the line width of the resist pattern 103 becoming smaller during etching. Furthermore, an influence of heat and ultraviolet radiation coming from plasma used for dry etching causes stresses associated with heat stresses and degradation in the resist pattern 103. Consequently, as the processing precision becomes finer, the upper part of the resist pattern 103 collapses from the insufficient strength of the resist pattern 103 as shown in FIG. 3B, i.e., a so-called resist collapse 103a occurs. The resist pattern 103 in which the resist collapse 103a occurs serves as an etching mask as it is, so that a part of the thermal oxide film 102 below the resist collapse 103a is prevented from being etched. Consequently, a pattern abnormality 102a is formed in the thermal oxide film 102 as shown in FIG. 3C.

Therefore, as shown in FIG. 3D, even when the resist pattern 103 is removed by performing ashing and cleaning processes, the pattern abnormality 102a remains in the thermal oxide film 102 as it is.

As described above, the known method for fabricating a semiconductor device has the problem that a resist collapse 103a occurs in a resist pattern 103 at the etching of a film to be processed.

SUMMARY OF THE INVENTION

The present invention is made to solve the above problem, and therefore an object of the present invention is to realize a fine pattern without causing resist collapse.

After various studies, the present inventors found that a patterned resist pattern exposed to a gas containing sulfur increases the strength of each of the sidewalls of the resist pattern.

To be specific, a resist pattern made of a commonly used organic material such as novolac and containing carbon was exposed to a gas made of, for example, sulfur dioxide, and the resultant resist pattern was measured by Auger Electron Spectroscopy (AES). Consequently, sulfur atoms were identified in each of the sidewalls of the resist pattern. Furthermore, it has been shown by X-ray Photoelectron Spectroscopy (XPS) that bonds between carbon (C) and sulfur (S) (hereinafter, referred to as C—S bonds) exist in each of the sidewalls. A compound containing C—S bonds has a relatively low vapor pressure, and therefore it remains in each of the sidewalls of the resist pattern without being eliminated therefrom. In addition, the energy of the C—S bond is 175 kcal/mol, which is larger than the value of the energy of the bond between carbon and carbon (C—C bond), that is, 144 kcal/mol, so as to increase the strength of each of the sidewalls of the resist pattern. As a result, the resist collapse can be prevented.

More specifically, a method for fabricating a semiconductor device according to the present invention comprises the steps of: forming a thin film made of an inorganic material; forming a resist film containing carbon on the thin film and thereafter patterning the formed resist film to form a resist pattern from the resist film; exposing the resist pattern to a gas containing sulfur; and performing dry etching of the thin film using as a mask the resist pattern exposed to the gas containing sulfur.

According to the method for fabricating a semiconductor device of the present invention, a compound containing C—S bonds is generated on each of the sidewalls of the resist pattern as described above. Therefore, the strength of each of the sidewalls of the resist pattern is increased. As a result, a resist collapse can be prevented from being caused in a fine resist pattern, thereby obtaining a desired fine pattern of the thin film made of an inorganic material.

A sulfur dioxide gas described in International Publication Number WO98/32162 pamphlet is employed for etching a thin film made of an organic material, and therefore this is different from the case of the present invention where the target to be etched is made of an inorganic material.

In the method for fabricating a semiconductor device of the present invention, it is preferable that the inorganic material contains silicon and an etching gas employed for the dry etching is a fluorocarbon gas.

In the method for fabricating a semiconductor device of the present invention, the gas containing sulfur is preferably sulfur dioxide.

In the method for fabricating a semiconductor device of the present invention, the gas containing sulfur is preferably in a plasma state.

In the method for fabricating a semiconductor device of the present invention, the step of exposing the resist pattern to the gas containing sulfur and the step of performing dry etching preferably constitute the same step. This eliminates the need for providing a process step for only exposing the resist pattern to the gas containing sulfur, thereby improving the throughput of the fabricating process.

In the method for fabricating a semiconductor device of the present invention, the line width of the resist pattern is preferably 200 nm or less.

In the method for fabricating a semiconductor device of the present invention, the value of the ratio of the height of the resist pattern to the line width thereof is preferably 2.8 or more.

In this way, when the resist pattern is fine and has a high aspect ratio, the effects of the present invention become more noticeable.

DESCRIPTION OF THE PREFERRED EMBODIMENTS (Embodiment 1)

A first embodiment of the present invention will be described hereinafter with reference to the drawings.

FIGS. 1A through 1D show the cross-sectional structures of a semiconductor device in the order corresponding to process steps of the method for fabricating the same according to a first embodiment of the present invention.

Figure 1A:
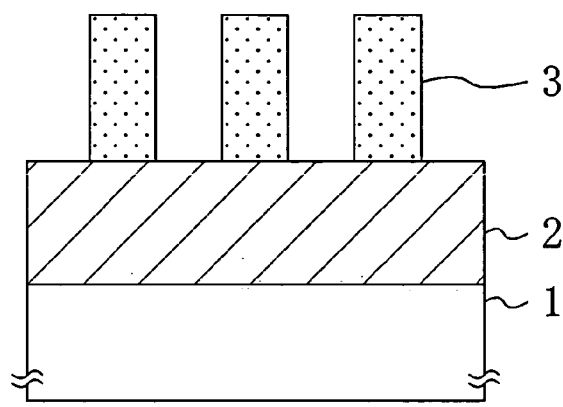
FIGS. 1A through 1D are structural cross sectional views showing a method for fabricating a semiconductor device according to a first embodiment of the present invention in the order corresponding to process steps of the same method.

First, as shown in FIG. 1A, a silicon oxide film 2 made of an inorganic material is formed in the upper part of a semiconductor substrate 1 made of silicon (Si), for example, by a thermal oxidation method. Subsequently, the top of the formed silicon oxide film 2 is coated with a resist film. Thereafter, the resist film is patterned using a lithography method, thereby forming a resist pattern 3.

Figure 1B:
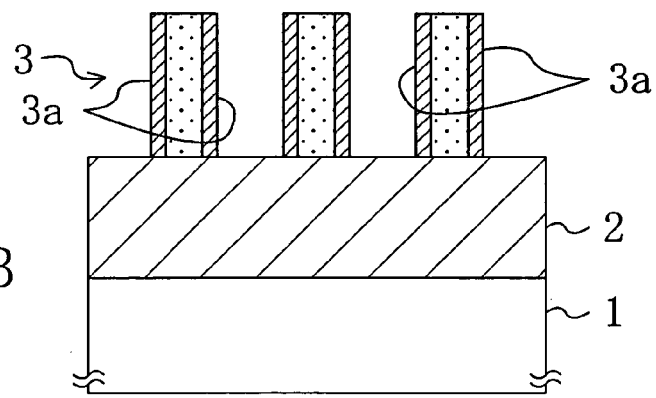

Next, as shown in FIG. 1B, the resist pattern located on the semiconductor substrate 1 is exposed to plasma-like sulfur dioxide ($SO_2$), thereby forming a C—S reaction part 3a containing C—S bonds on each of the sidewalls of the resist pattern 3. More specifically, plasma is generated, for example, using inductively coupled plasma etching equipment, wherein the flow rate of sulfur dioxide is 50 ml/min (0° C., 1 atm), the gas pressure is 1 Pa, the upper discharge power is 200 W, and the lower discharge power is 30 W. This plasma irradiation allows sulfur dioxide to be decomposed into sulfur (to be formed in plasma) and then allows the generated sulfur atoms to bond to carbon atoms contained in the resist pattern 3, thereby forming a C—S reaction part 3a on each of the sidewalls of the resist pattern 3. The formed C—S reaction part 3a protects each of the sidewalls of the resist pattern 3 and also improves the strength of the resist pattern 3. At this time, the silicon oxide film 2 hardly reacts with sulfur. Therefore, sulfur is not adhered to the surface of the silicon oxide film 2 so that the next process step for performing dry etching of the silicon oxide film 2 is not affected.

Figure 1C:
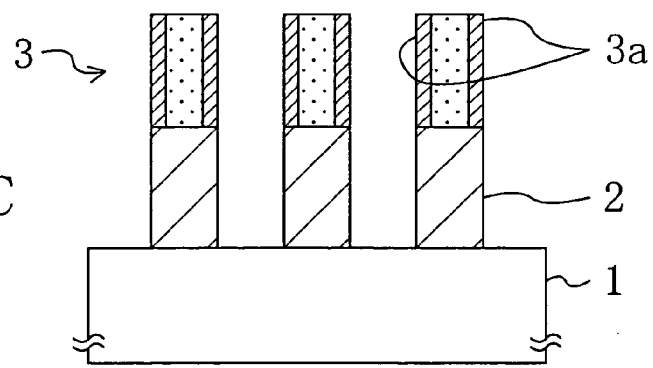

Next, as shown in FIG. 1C, the silicon oxide film 2 is etched using a fluorocarbon gas as an etching gas and the resist pattern 3 as a mask. For example, tetrafluorocarbon ($CF_4$) and trifluoromethyl ($CHF_3$) are employed as a fluorocarbon gas. At this time, since each of the sidewalls of the resist pattern 3 is protected by the C—S reaction part 3a, etching can be performed without causing the resist pattern 3 to collapse.

Figure 1D:
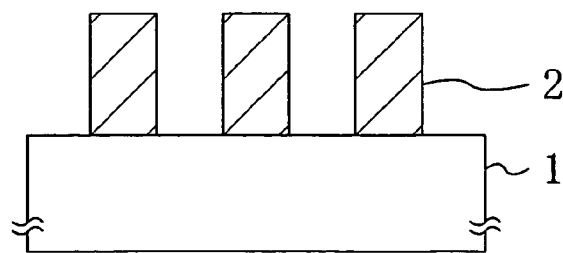

Next, as shown in FIG. 1D, the resist pattern 3 is removed through ashing and cleaning processes.

Thereafter, the semiconductor device is completed in the usual manner.

In this way, according to the first embodiment, the formed resist pattern 3 is exposed to the gas containing sulfur, resulting in each of the sidewalls of the resist pattern 3 being protected by the C—S reaction part 3a and being improved in strength. Therefore, the resist collapse can be prevented from being caused in the resist pattern 3, thereby obtaining a desired shape of the silicon oxide film 2.

(Embodiment 2)

Figure 2A:
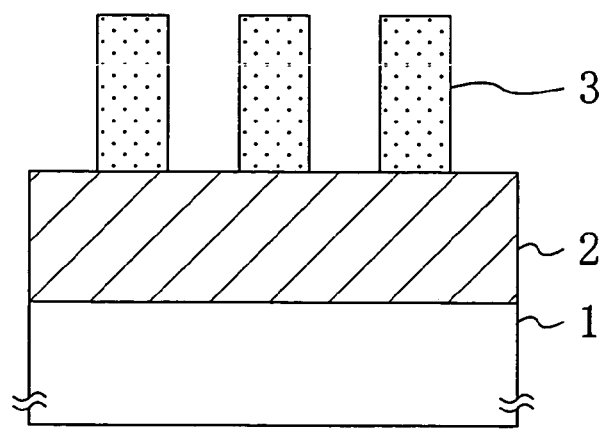
FIGS. 2A through 2C are structural cross sectional views showing a method for fabricating a semiconductor device according to a second embodiment of the present invention in the order corresponding to process steps of the same method.
Figure 2B:
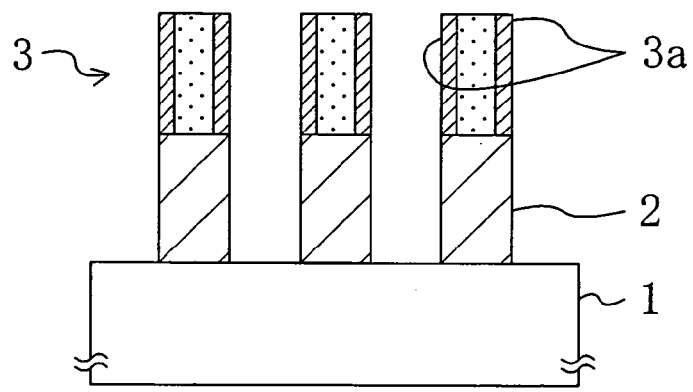
Figure 2C:
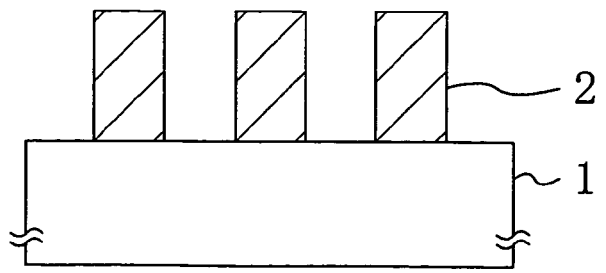
Figure 3A:
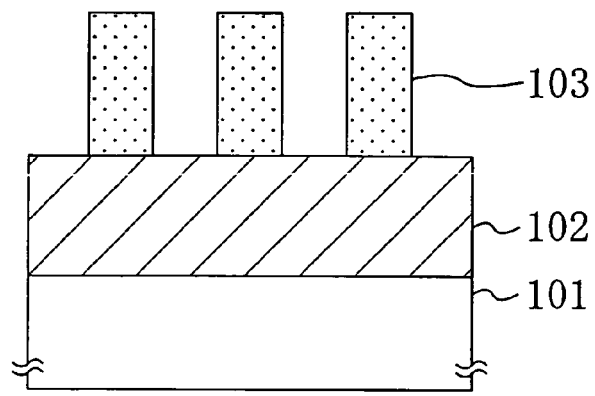
FIGS. 3A through 3D are structural cross sectional views showing a known method for fabricating a semiconductor device in the order corresponding to process steps of the same method.
Figure 3B:
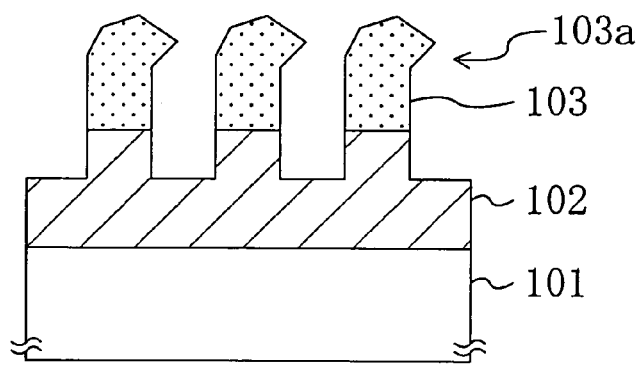
Figure 3C:
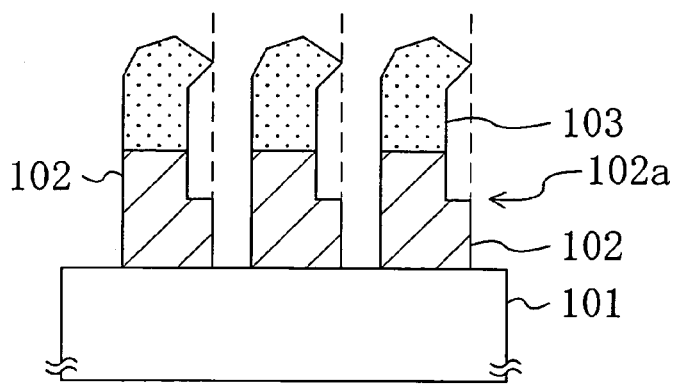
Figure 3D:
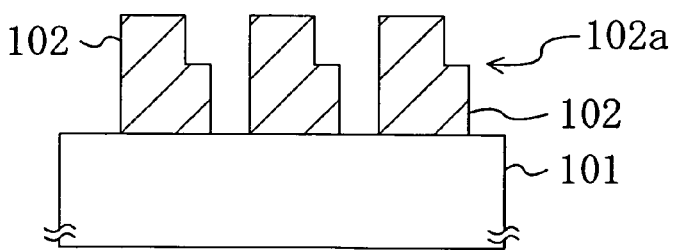

FIGS. 2A through 2C show the cross-sectional structures of a semiconductor device in the order corresponding to process steps of a method for fabricating the same according to a second embodiment of the present invention.

First, as shown in FIG. 2A, a silicon oxide film 2 made of an inorganic material is formed in the upper part of a semiconductor substrate 1 made of silicon, for example, by a thermal oxidation method. Subsequently, the top of the formed silicon oxide film 2 is coated with a resist film. Thereafter, the resist film is patterned using a lithography method, thereby forming a resist pattern 3.

Next, as shown in FIG. 2B, the silicon oxide film 2 is etched by using a fluorocarbon gas as an etching gas with a sulfur dioxide gas being supplied and by using the resist pattern 3 as a mask. More specifically, capacitively coupled plasma etching equipment is employed, wherein the flow rate of tetrafluorocarbon ($CF_4$) is 50 ml/min, the flow rate of trifluoromethyl ($CHF_3$) is 30 ml/min, the flow rate of a carrier gas made of argon is 500 ml/min, the flow rate of sulfur dioxide is 30 ml/min, the whole gas pressure is 5 Pa, the upper discharge power is 1000 W, and the lower discharge power is 1500 W. Here, the flow rate of each gas is the one in a standard state, i.e., under 0° C. and 1 atm.

This etching process allows sulfur dioxide added to the etching gas to generate plasma and to be decomposed, and sulfur atoms produced by this decomposition are bonded to carbon atoms contained in the resist pattern 3, thereby forming a C—S reaction part 3a on each of the sidewalls of the resist pattern 3. The formed C—S reaction part 3a protects each of the sidewalls of the resist pattern 3 and also improves the strength of the resist pattern 3. At this time, sulfur hardly reacts with the silicon oxide film 2. Therefore, sulfur does not affect the etching of the silicon oxide film 2.

Next, as shown in FIG. 2C, the resist pattern 3 is removed through ashing and cleaning processes.

Thereafter, a semiconductor device is completed in the usual manner.

In this way, according to the second embodiment, when dry etching is performed on the silicon oxide film 2 by using the formed resist pattern 3 as a mask, the gas containing sulfur is added to the etching gas. Therefore, each of the sidewalls of the resist pattern 3 can be protected by the C—S reaction part 3a and improved in strength. As a result, resist collapse can be prevented from being caused in the resist pattern 3, thereby obtaining a desired shape of the silicon oxide film 2.

Furthermore, the need for providing a process step of only exposing the resist pattern 3 to the gas containing sulfur is eliminated, resulting in improved throughput of the fabricating process.

In the first and second embodiments, the silicon oxide film 2 is employed as a film to be etched. However, even if another silicon oxide film such as TEOS (tetra-ethyl-orthosilicate) or BPSG (boron-doped phospho-silicate glass), a silicon nitride film, a silicon oxynitride film, polysilicon, or amorphous silicon is employed as a film to be etched, the same effects can be obtained.

This method is also effective in etching metal interconnect made of copper (Cu) or aluminium (Al).

Although tetrafluorocarbon and trifluoromethyl are employed as the etching gas, other etching gases may be employed.

Although sulfur dioxide is employed as the gas containing sulfur, sulfur monoxide (SO) may be employed.

It is preferable that the line width of the resist pattern 3 is 200 nm or less and the value of the ratio of the height of the resist pattern 3 to the line width thereof (aspect ratio) is 2.8 or more. In this way, when the resist pattern is fine and has a high aspect ratio, the effects of the present invention become more noticeable.

What is claimed is:

1. A method for fabricating a semiconductor device, comprising the steps of:

forming a thin film made of an inorganic material;

forming a resist film containing carbon on the thin film and thereafter patterning the formed resist film to form a resist pattern from the resist film;

exposing the resist pattern to a gas containing sulfur to improve a strength of sidewalls of the resist pattern; and performing dry etching of the thin film using as a mask the resist pattern whose strength has been improved because of the gas containing sulfur.

2. The method for fabricating a semiconductor device of claim 1, wherein the inorganic material contains silicon, and an etching gas employed for the dry etching is a fluorocarbon gas.

3. The method for fabricating a semiconductor device of claim 1, wherein the gas containing sulfur is sulfur dioxide.

4. The method for fabricating a semiconductor device of claim 1, wherein the gas containing sulfur is in a plasma state.

5. The method for fabricating a semiconductor device of claim 1, wherein the step of exposing the resist pattern to the gas containing sulfur and the step of performing dry etching constitute the same step.

6. The method for fabricating a semiconductor device of claim 1, wherein a line width of the resist pattern is 200 nm or less.

7. The method for fabricating a semiconductor device of claim 1, wherein a value of the ratio of a height of the resist pattern to a line width thereof is 2.8 or more.

* * * * *